United States Patent
Yamamoto et al.

(10) Patent No.: US 6,620,290 B2
(45) Date of Patent: Sep. 16, 2003

(54) PLASMA PROCESS APPARATUS

(75) Inventors: Tatsushi Yamamoto, Nara (JP); Masaya Okamoto, Kyoto (JP); Masaki Hirayama, Sendai (JP); Tadahiro Ohmi, 2-1-17-301, Komegafukuro, Aoba-ku, Sendai-shi, Miyagi (JP)

(73) Assignees: Sharp Kabushiki Kaisha, Osaka (JP); Tadahiro Ohmi, Miyagi (JP)

( * ) Notice: Subject to any disclaimer, the term of this patent is extended or adjusted under 35 U.S.C. 154(b) by 0 days.

(21) Appl. No.: 09/758,292

(22) Filed: Jan. 12, 2001

(65) Prior Publication Data
US 2001/0050058 A1 Dec. 13, 2001

(30) Foreign Application Priority Data
Jan. 14, 2000 (JP) ......................... 2000-005673

(51) Int. Cl.$^7$ ............................ H05H 1/00; C23C 16/00; H01J 7/24
(52) U.S. Cl. ............................ 156/345.41; 156/345.42; 156/345.36; 118/723 MW; 118/723 MR; 118/723 MA; 315/111.21
(58) Field of Search ................. 156/345.41, 345.36, 156/345.42; 118/723 MW, 723 MR, 723 MA; 315/111.21, 111.41

(56) References Cited

U.S. PATENT DOCUMENTS 5,134,965 A  *  8/1992  Tokuda et al. ...... 118/723 MW
5,788,798 A  *  8/1998  Mabuchi et al. ............ 156/345
6,189,481 B1  *  2/2001  Akimoto ............ 118/723 MW

FOREIGN PATENT DOCUMENTS

| JP | 62-298106 A | * | 12/1987 | ......... H01L/21/205 |
| JP | 63-80522 A | * | 4/1988 | ......... H01L/21/205 |
| JP | 63293824 A |  | 11/1988 |  |
| JP | 1-184921 A | * | 7/1989 | ......... H01L/21/302 |
| JP | 2-170530 A |  | 7/1990 |  |
| JP | 3-94422 A | * | 4/1991 | ......... H01L/21/205 |
| JP | 6-49647 A | * | 2/1994 | ............ C23C/16/50 |
| JP | 7-263348 A | * | 10/1995 | ......... H01L/21/205 |
| JP | 8-316198 |  | 11/1996 |  |
| JP | 11-111493 |  | 4/1999 |  |

* cited by examiner

Primary Examiner—Parviz Hassanzadeh
(74) Attorney, Agent, or Firm—Birch, Stewart, Kolasch & Birch, LLP

(57) ABSTRACT

A plurality of microwave introduction windows are placed at the top wall of the reaction chamber. Microwaves of the same power are introduced into, e.g., two microwave introduction windows that are equivalent in location relationship with respect to the sidewall of the reaction chamber, while microwaves of different power are introduced into, e.g., two microwave introduction windows that are non-equivalent in location relationship with respect to the sidewall. Thus, a cost-effective plasma process apparatus is obtained which can realize uniform plasma processing even if the plasma being generated within the reaction chamber has varied load impedance.

3 Claims, 15 Drawing Sheets

PLASMA PROCESS APPARATUS

BACKGROUND OF THE INVENTION

1. Field of the Invention

The present invention relates to plasma process apparatuses, and more particularly, to a plasma process apparatus for use in fabrication of a semiconductor device, a liquid crystal display device or the like.

2. Description of the Background Art

Conventionally, a plasma process apparatus with a capacitively-coupled plasma source has been utilized for fabricating a semiconductor device, a liquid crystal display device or the like, in which a pair of electrodes are placed within a process chamber and supplied with high-frequency power of 13.56 MHz as means of plasma excitation. In such an apparatus, an object being processed is placed on one of the electrodes. If the object being processed is conductive, it is possible to excite plasma using direct-current (DC) power even with such a capacitively-coupled type apparatus.

Recently, in an effort to realize a more advanced, highly productive device fabrication technique, a plasma process apparatus incorporating a plasma source capable of exciting so-called "high density plasma" has been developed extensively. Although plasma exciting means based on a variety of principles can be employed for such an apparatus, the one utilizing microwave is highly advantageous. When employing the microwave, besides the fact that the high density plasma as mentioned above can be obtained, it becomes unnecessary to provide a process chamber with an electrode for introduction of power necessary at least for plasma excitation. This eliminates a possibility of contamination of impurities associated with the electrode material. In addition, the plasma excited with the microwave has a potential that is lower than the plasma obtained by the capacitively-coupled type apparatus, which leads to another advantage that influx of energy particles to the surface of the object being processed can be controlled to a greater extent.

With conventional apparatuses, however, it has been difficult to realize a plasma state that permits uniform processing of a relatively wide area. A number of techniques have been proposed to address this problem.

One of the techniques is disclosed in Japanese Patent Laying-Open No. 11-111493. FIGS. 16 and 17 schematically show vertical and horizontal cross sectional views, respectively, of a plasma process apparatus disclosed therein.

Referring to FIGS. 16 and 17, the plasma process apparatus includes, among others, a reaction chamber 120, a microwave introduction window 102, a stage 107, a dielectric line 111, a microwave distributor 113, a microwave waveguide 114, and a microwave oscillator 115.

The inside of metal reaction chamber 101 constitutes a reaction chamber 120, whose top is sealed airtight by microwave introduction window 102. Within reaction chamber 120 a stage 107 is placed for holding thereon a semiconductor substrate 108 as an object being processed. A high-frequency power supply is connected to stage 107. Four partitioned dielectric lines 111 are provided above microwave introduction window 102, with a prescribed spacing (air gap 112) provided therebetween. An outer periphery of each dielectric line 111 is covered with a metal plate 116. Each dielectric line 111 has its side connected to microwave waveguide 114 via microwave distributor 113. Microwave oscillator 115 is attached to the end of microwave waveguide 114.

In the operation of this apparatus, the interior of reaction chamber 120 is first evacuated down to a required level of pressure, followed by introduction of reaction gas therein via a gas feed tube. Microwave are then oscillated at microwave oscillator 115, which are led via waveguide 114 to microwave distributor 113.

The microwave divided at microwave distributor 113 are led to respective dielectric lines 111 in phase with the same power. The microwave led to dielectric lines 111 pass through air gap 112 and introduced into reaction chamber 120 via microwave introduction window 102. With the introduction of the microwave, plasma is produced within reaction chamber 120, whereby plasma processing (etching) is applied on the surface of substrate 108 placed on stage 107.

Other techniques to realize uniform plasma processing in a relatively wide area are disclosed, e.g., in Japanese Patent Laying-Open No. 8-316198, Japanese Patent Publication No. 7-105385 and Japanese Patent No. 2641450.

Japanese Patent Laying-Open No. 8-316198 discloses a plasma process apparatus wherein microwave oscillated by a single microwave oscillator are branched and transmitted via a plurality of dielectric layers into a reaction chamber.

Japanese Patent Publication No. 7-105385 discloses a plasma process apparatus wherein a plurality of waveguides are connected to the upper part of a process chamber, and a plurality of microwave oscillators are respectively connected to the waveguides, whereby a plurality of microwave are controlled independently from each other.

Japanese Patent No. 2641450 discloses a plasma process apparatus that is similar to the one disclosed in Japanese Patent Publication No. 7-105385 in that each waveguide requires a respective set of microwave oscillator. The difference therebetween is only the way of plasma excitation.

Microwaves generally refer to electro-magnetic waves of frequencies of 1–30 GHz. However, in the field of engineering, waves of VHF band (30–300 MHz), UHF band (0.3–3 GHz) and milliwave band (30–300 GHz) can be handled in the same manner as the microwaves of the general definition. Hence, in this specification, the electro-magnetic waves of these frequency bands are collectively referred to as the microwaves.

The techniques disclosed in the references above have disadvantages as follows.

First, in the plasma process apparatus of Japanese Patent Laying-Open No. 11-111493 as shown in FIGS. 16 and 17, microwave in phase with the same power are introduced into four partitioned dielectric lines 111. Of microwave introduction window 102, however, in a region SA that is closer to a sidewall 101b of reaction chamber 101 and in a region SB farther from the sidewall 101b, there are differences in the potential states and in the manners of excited particle generation/dissipation within the plasma. Accordingly, load impedance of the plasma immediately beneath the region SA differs from that beneath the region SB, thereby hindering a uniform plasma process.

In the plasma process apparatus of Japanese Patent Laying-Open No. 8-316198, the dielectric layer is partitioned only into two parts. This is insufficient for uniformly processing a substrate of wide area. Even if the number of partition of the dielectric layer is increased, load impedance differs in different positions as in the case of Japanese Patent Laying-Open No. 11-111493, which again hinders the uniform plasma process.

In Japanese Patent Publication No. 7-105385 and Japanese Patent No. 2641450, one microwave oscillator is required for a respective waveguide. In general, it is more advantageous from the standpoint of cost saving to prepare, instead of a plurality of oscillators each of low power level, one powerful oscillator capable of supplying the equivalent power. Accordingly, the apparatuses disclosed in these references are disadvantageous in terms of cost saving, and will become more disadvantageous if they are to be used to process a substrate of large area.

SUMMARY OF THE INVENTION

An object of the present invention is to provide a cost-effective plasma process apparatus that allows a uniform plasma process even if plasma produced within a reaction chamber exhibits different load impedance in different positions.

The plasma process apparatus according to the present invention applies a plasma process on a substrate employing reaction gas that has been excited to a plasma state by microwaves. The plasma process apparatus includes a chamber and a plurality of microwave introduction windows. With a substrate held therein, the chamber has a main wall facing the surface of the substrate and a sidewall surrounding the side of the substrate. The plasma process is performed within the chamber. The plurality of microwave introduction windows are provided at the main wall to face the interior of the chamber for introduction of the microwaves into the chamber. Of the plurality of microwave introduction windows, at least two microwave introduction windows that are equivalent in location relationship with respect to the sidewall are supplied with microwaves of essentially identical power. At least two microwave introduction windows that are non-equivalent in location relationship with respect to the sidewall are supplied with microwaves of different power.

In the plasma process apparatus of the present invention, microwaves of different power are introduced into microwave introduction windows that are non-equivalent in location relationship. Accordingly, it becomes possible to make the plasma states immediately beneath the respective microwave introduction windows approximately identical to each other even if load impedance of the plasma beneath those windows differs from each other.

Load impedance of the plasma immediately beneath the microwave introduction windows that are equivalent in location relationship should be essentially identical to each other. Thus, microwaves of the same power are introduced into these microwave introduction windows, thereby controlling the plasma states beneath the windows to become substantially identical to each other.

The plasma can thus be made to have a uniform plasma state throughout the entire chamber, and therefore, it becomes possible to apply a uniform plasma process on a substrate of large area.

Microwave are led to the microwave introduction windows that are equivalent in location relationship using a single, powerful microwave oscillator, which is advantageous in cost saving.

With the plasma process apparatus as described above, when the plasma generated within the chamber is expressed as equivalent loads of parallel lumped-constant circuits, the plasma generated by microwave introduced from at least two microwave introduction windows equivalent in location relationship has load impedance essentially identical to each other.

In this manner, the microwave are supplied taking into consideration even the load impedance of plasma being generated within the process chamber. This enables a more uniform plasma process.

Preferably, the plasma process apparatus is further provided with a microwave waveguide for transmission of microwaves. One such microwave waveguide is branched and connected to respective ones of at least two microwave introduction windows that are equivalent in location relationship.

One microwave oscillation source is connected to this single microwave waveguide, so that it becomes possible to introduce microwaves to respective microwave introduction windows that are equivalent in location relationship using one powerful microwave oscillation source.

Preferably, the plasma process apparatus is further provided with a microwave oscillation source for oscillation of microwaves. One such microwave oscillation source is connected to the one microwave waveguide.

Thus, it becomes possible to achieve a cost-effective plasma process apparatus.

Preferably, the plasma process apparatus is further provided with a microwave waveguide for transmitting microwave, and an attenuator that can adjust an amount of attenuation of the microwave. One such microwave waveguide is branched and connected to respective ones of at least two microwave introduction windows that are non-equivalent in location relationship. One such attenuator is connected to a respective branched portion of the microwave waveguide.

Thus, it becomes possible to introduce microwaves even to the microwave introduction windows that are non-equivalent in location relationship using a single, powerful microwave oscillator. Accordingly, a still more cost-effective plasma process apparatus can be achieved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to the drawings.

First Embodiment

Figure 1:
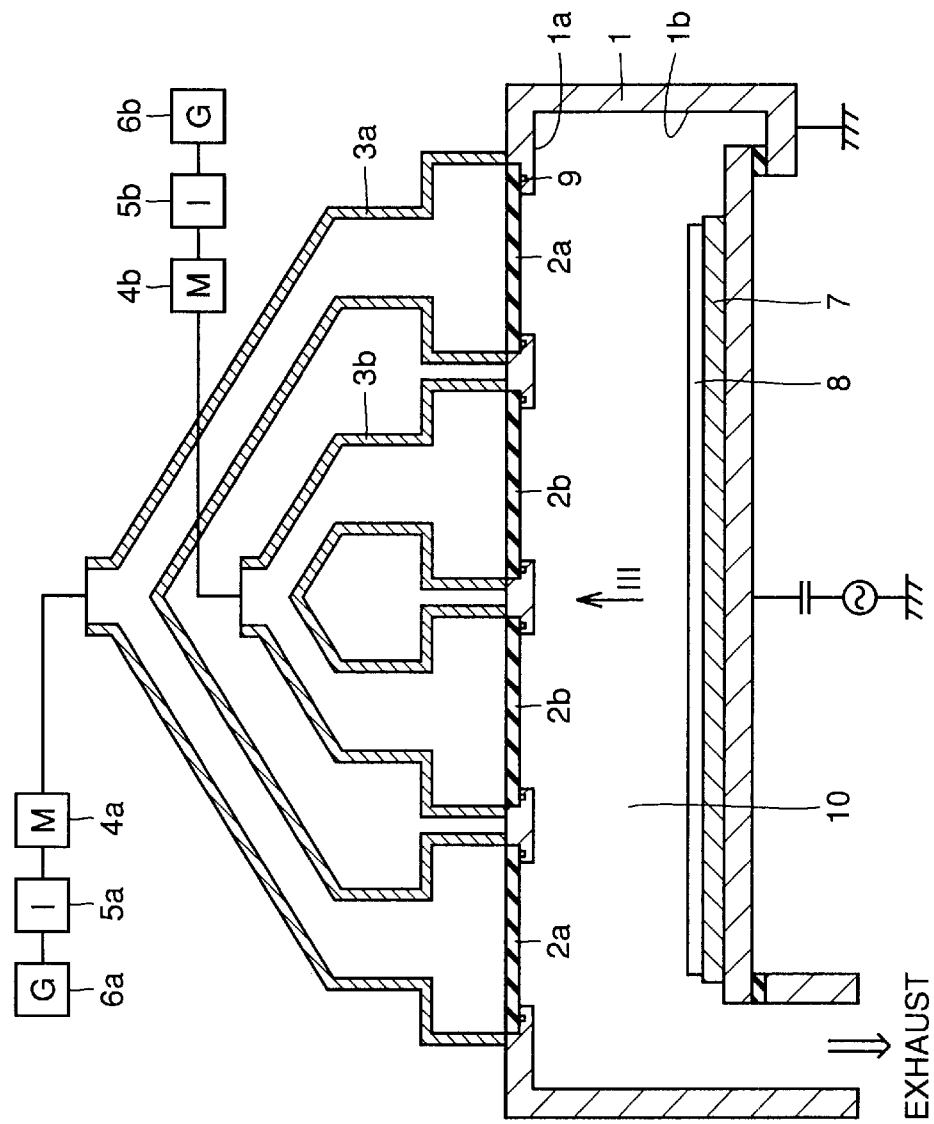
FIG. 1 is a cross sectional view schematically showing a configuration of a plasma process apparatus according to a first embodiment of the present invention.
Figure 2:
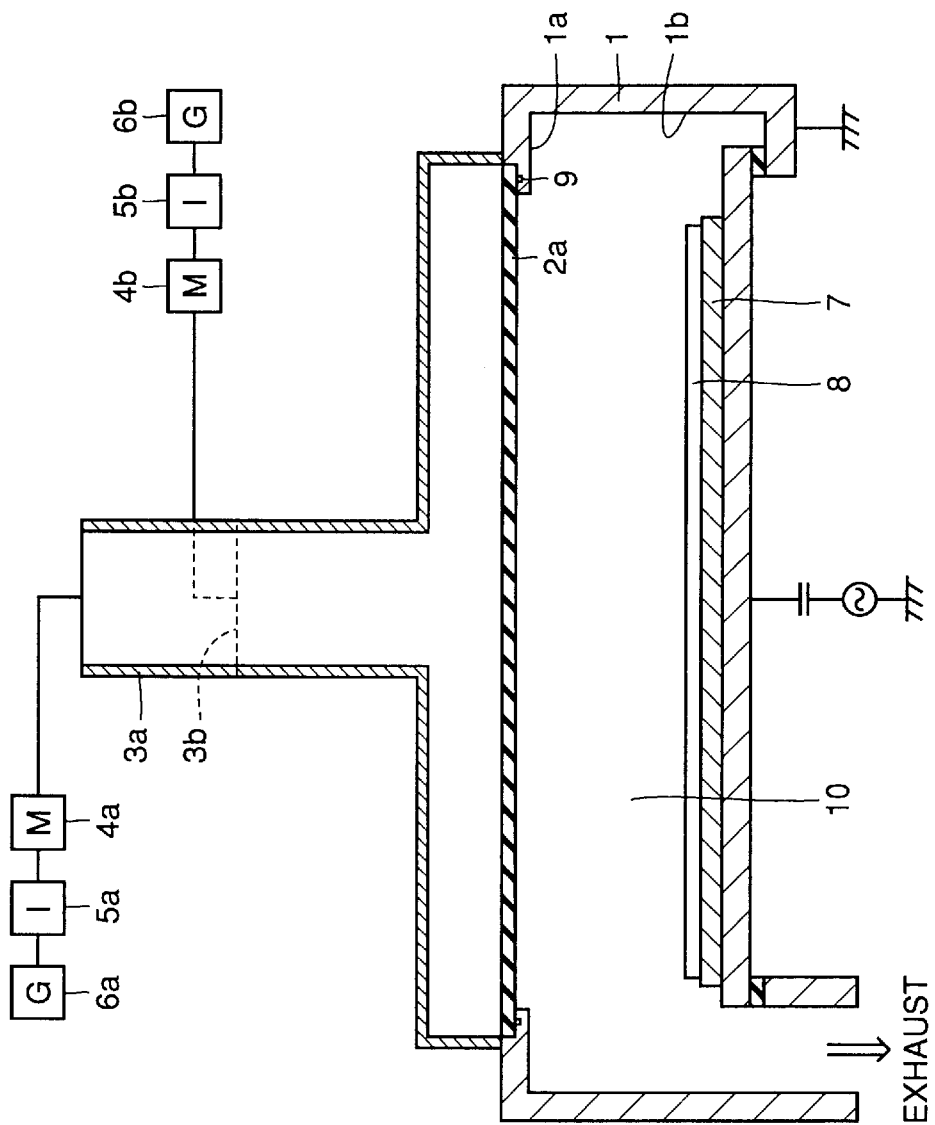
FIG. 2 is another cross sectional view schematically showing the configuration of the plasma process apparatus according to the first embodiment of the present invention.

The first embodiment of the present invention will now be described with reference to FIGS. 1–3. FIG. 1 corresponds to a cross section taken along the line I—I in FIG. 3. FIG. 2 corresponds to a cross section taken along the line II—II in FIG. 3.

Referring primarily to FIGS. 1 and 2, the plasma process apparatus of the present embodiment includes a reaction chamber 1, microwave introduction windows 2a, 2b, waveguides 3a, 3b, matching devices 4a, 4b, isolators 5a, 5b, microwave oscillators 6a, 6b, and a substrate holder 7.

The inside of reaction chamber 1 made of a conductor, e.g., metal, constitutes a process chamber 10. A top wall 1a of reaction chamber 1 has four openings, for example. Microwave introduction window 2a or 2b is attached to respective one of the openings to face process chamber 10.

Figure 3:
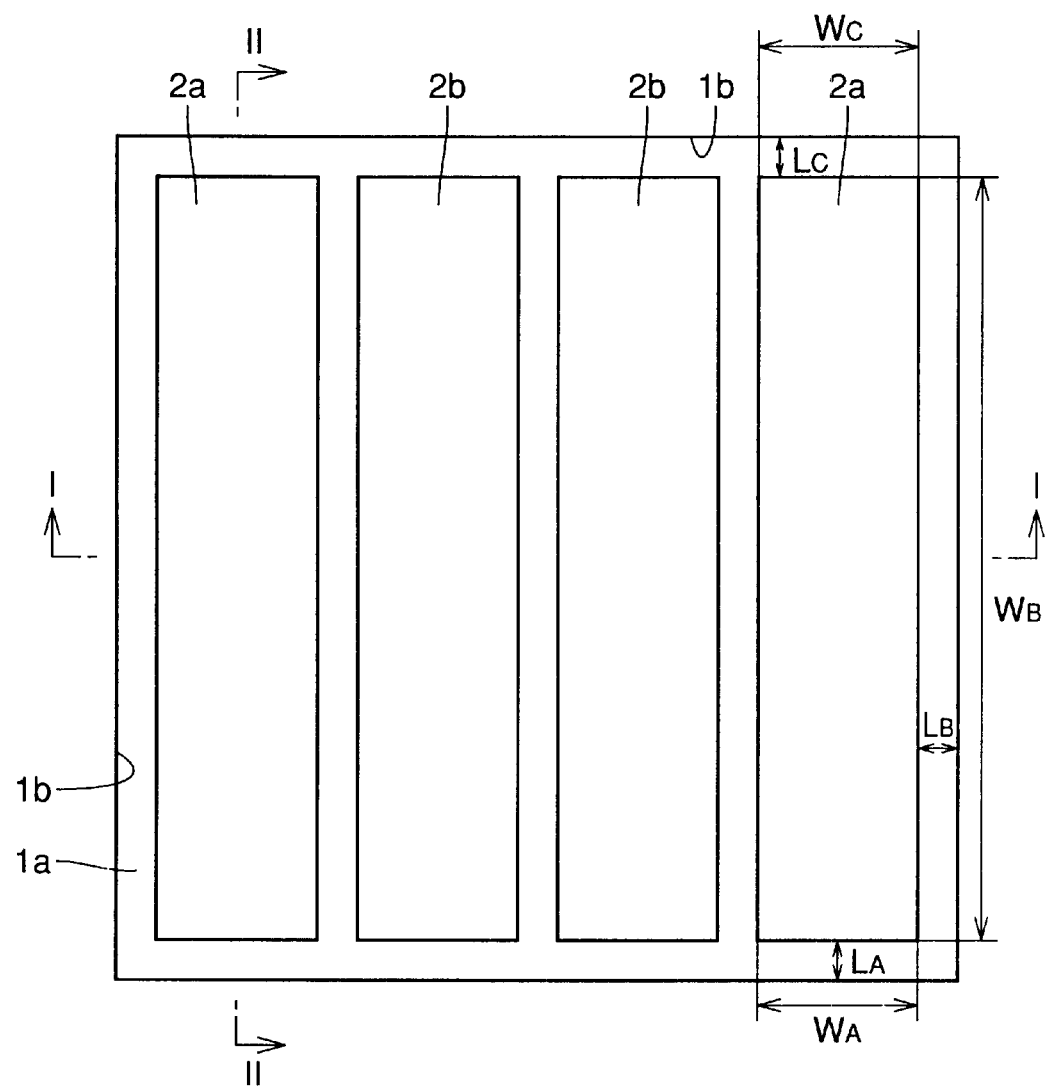
FIG. 3 shows an arrangement of microwave introduction windows as seen from a direction indicated by an arrow III in FIG. 1.

Referring primarily to FIG. 3, two microwave introduction windows 2a, 2a at respective sides are equivalent to each other in location relationship with respect to a sidewall 1b of reaction chamber 1. Similarly, two microwave introduction windows 2b, 2b at the inner region are equivalent to each other in location relationship with respect to sidewall 1b. Microwave introduction windows 2a and 2b are non-equivalent to each other in location relationship with respect to sidewall 1b.

Herein, the term "equivalent in location relationship" means that the relevant microwave introduction windows have their opposing lengths ($W_A$, $W_B$, $W_C$) and opposing spacing ($L_A$, $L_B$, $L_C$) with respect to sidewall 1b approximately equal to each other. Microwave introduction windows "equivalent in location relationship" may include those located in point or line symmetry at top wall surface 1a of reaction chamber 1, as long as their opposing lengths and spacing are approximately equal to each other.

Referring primarily to FIG. 1, gaps between microwave introduction windows 2a, 2b and reaction chamber 1 are sealed by means of O rings 9, whereby the interior of process chamber 10 is kept airtight. The interior of process chamber 10 is further evacuated by a vacuum pump (not shown) and kept in vacuum.

One waveguide 3a is branched and connected to microwave introduction windows 2a, 2a that are equivalent to each other in location relationship with respect to sidewall 1b. Another waveguide 3b is branched and connected to microwave introduction windows 2b, 2b that are equivalent to each other in location relationship with respect to sidewall 1b. Microwave oscillators 6a, 6b are connected to respective waveguides 3a, 3b, via isolators 5a, 5b and matching devices 4a, 4b, respectively. Thus, microwaves of the same power can be introduced into microwave introduction windows 2a and 2a (or 2b and 2b) that are equivalent to each other in location relationship, while microwave of different power can be introduced into microwave introduction windows 2a and 2b that are non-equivalent to each other in location relationship.

Substrate holder 7 is placed within process chamber 10, which is able to hold a substrate 8 such that it faces the top wall 1a of reaction chamber 1. Reaction chamber 1 is normally grounded, and a high frequency or DC bias is applied to substrate holder 7.

A gas feed tube for supply of reaction gas into process chamber 10 or the like is not shown in the drawing for simplification of illustration.

A relation between geometrical arrangement of microwave introduction windows and load impedance of plasma will now be explained.

Figure 4:
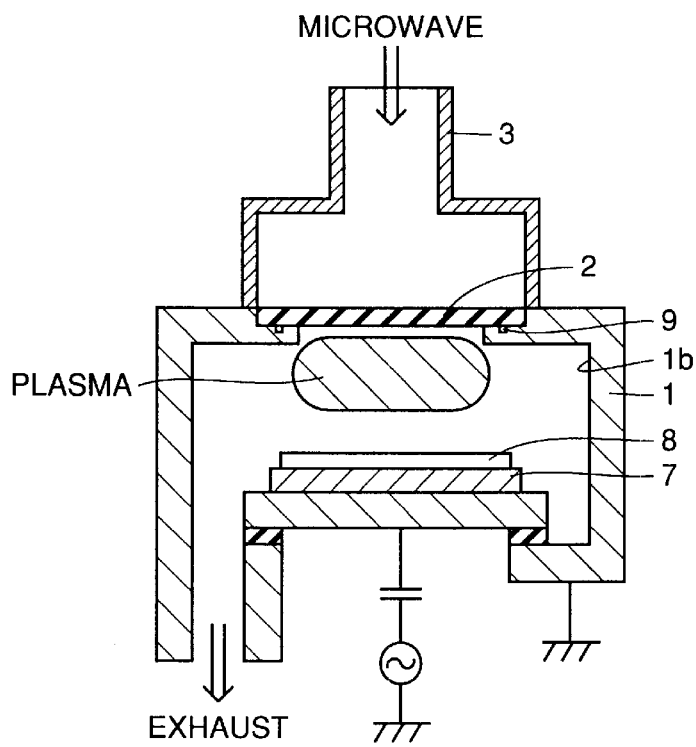
FIG. 4 is a schematic cross sectional view showing a configuration in the case where one waveguide transmission circuit for introduction of microwave is used for a relatively small reaction chamber.

Referring to FIG. 4, there is an opening on the top of reaction chamber 1, to which microwave introduction window 2 is attached by seals 9. Connected to the top of microwave introduction window 2 is a waveguide 3 for transmission of microwave. Matching device, isolator, microwave oscillator and the like, not shown, are connected to waveguide 3.

An exhaust device and a valve system, not shown, are operated to evacuate the interior of reaction chamber 1 to a prescribed level of pressure. Discharge gas is then introduced therein via a gas feed path, as necessary, so that the pressure is adjusted to the level for plasma generation. The pressure inside reaction chamber 1 is determined by balancing the exhaust rate (amount) and the gas feed rate (amount).

When microwave are introduced via microwave introduction window 2 into reaction chamber 1 under the condition where the interior of reaction chamber 1 has been adjusted to the pressure level for plasma generation, plasma is generated within reaction chamber 1. During this time, while ions and electrons ionized within the plasma are being consumed as they plunge into the walls of reaction chamber 1, ionization takes place in sequence, so that the plasma is maintained.

When the ions and electrons plunge into the walls of reaction chamber 1, potentials of the walls have a critical effect on their behaviors. Specifically, if the potential of the wall is positive, ions are rejected while electrons easily plunge therein, and the opposite applies if the potential of the wall is negative.

The plasma itself constantly maintains a positive potential with respect to the walls of reaction chamber 1, based on the mass difference between electrons and ions. The walls of reaction chamber 1 are made of conductor, normally grounded. There is a case where a high frequency or DC bias is applied to a substrate holding mechanism, e.g., substrate holder 7 holding substrate 8. Microwave introduction window 2, however, is electrically insulated, through which a direct current cannot flow. Accordingly, it is charged up with surface charges at the steady state, so that there is no in/out of net charges. In other words, the walls of reaction chamber 1 as a conductor and the surface of microwave introduction window 2 have different potentials. Thus, as seen from charged particles (electrons and ions) within the plasma generated, there exist walls different in potentials. This may cause deviation in the equilibrium states of charged particles within the plasma, in the region immediately beneath microwave introduction window 2 and in the peripheral region close to sidewall 1b.

Figure 5:
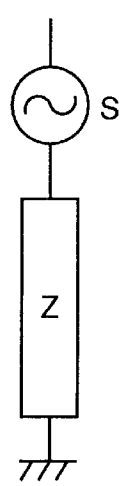
FIG. 5 illustrates load impedance of plasma in the plasma process apparatus shown in FIG. 4.

Assume that the plasma generating region is relatively small as shown in FIG. 4. In this case, the effect of the ground potential at sidewall 1b is expected even in the region immediately beneath microwave introduction window 2. Thus, there will not exist a big difference in plasma state between the peripheral region and the inner region that would cause a processing problem. Accordingly, it can be considered that the plasma generated in the plasma process apparatus shown in FIG. 4 has load impedance Z that is approximately uniform for the entire plasma, as shown in FIG. 5. In FIG. 5, S represents a power supplying system, which includes microwave oscillator, isolator, matching device and the like.

Figure 6:
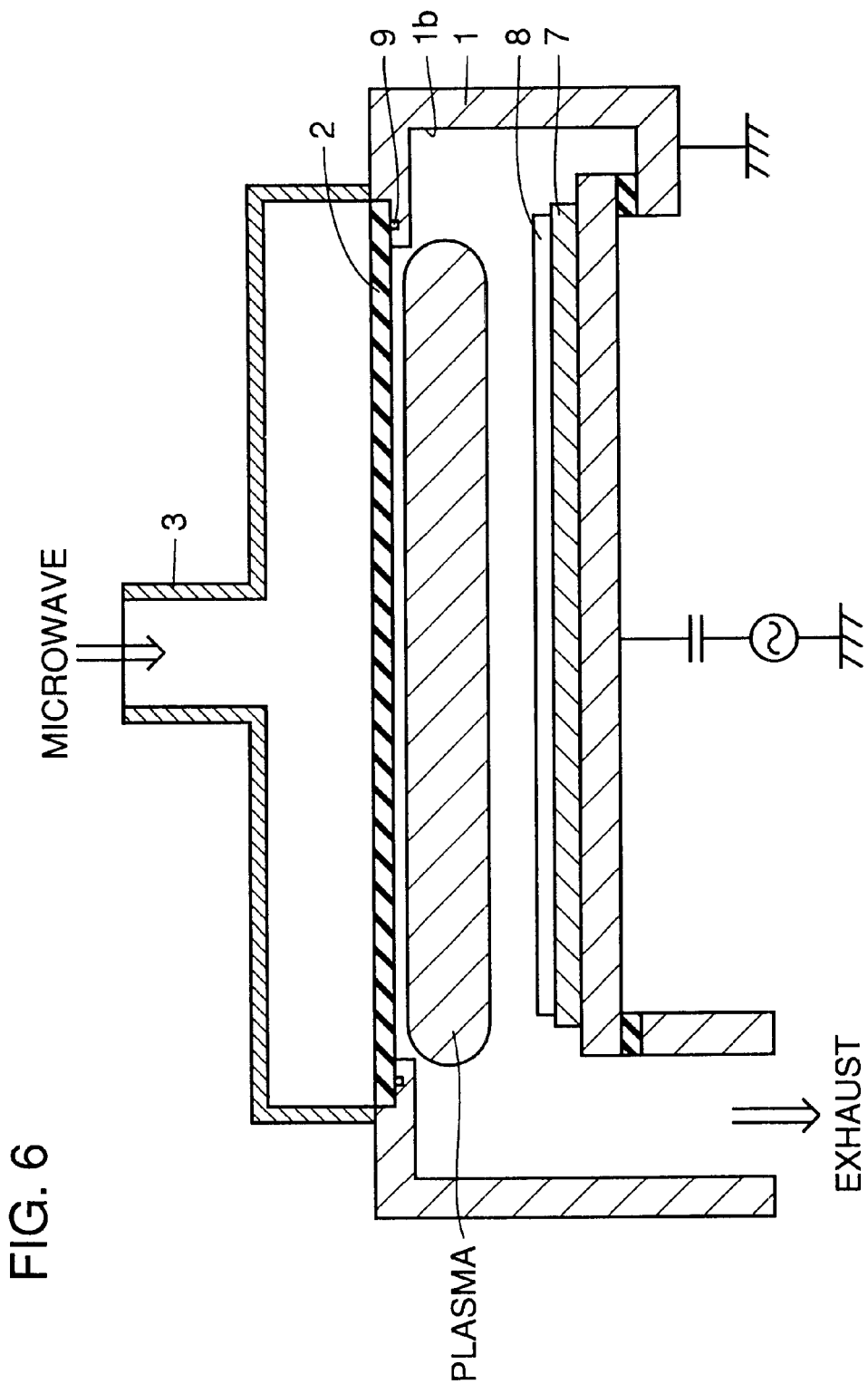
FIG. 6 is a schematic cross sectional view showing a configuration in the case where one waveguide transmission circuit for introduction of microwaves is used for a relatively large reaction chamber.
Figure 7:
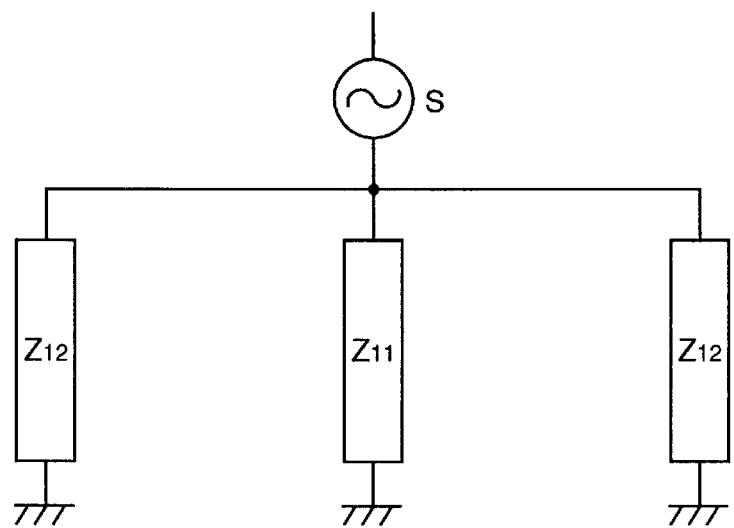
FIG. 7 illustrates load impedance of plasma in the plasma process apparatus shown in FIG. 6.

Now assume a large plasma generating region as shown in FIG. 6. In this case, there is a higher possibility that electrons will be lost from the plasma at its peripheral region near sidewall 1b because of the ground potential thereof, while such loss of electrons is unlikely at the inner region because there exists only microwave introduction window 2. Thus, the plasma generated by introduction of microwave from microwave introduction window 2 comes to show, in the equilibrium state, different densities at its peripheral region and its inner region. Accordingly, if the plasma in the large area is represented as equivalent loads of parallel lumped-constant circuits, load impedance $Z_{11}$ at the inner region of the plasma differs from load impedance $Z_{12}$ at the peripheral region thereof, as shown in FIG. 7.

If the load impedance of the plasma differs at its inner region and its peripheral region, the densities of plasma differ accordingly, as described above. In such a case, a uniform plasma process cannot be realized.

Figure 8:
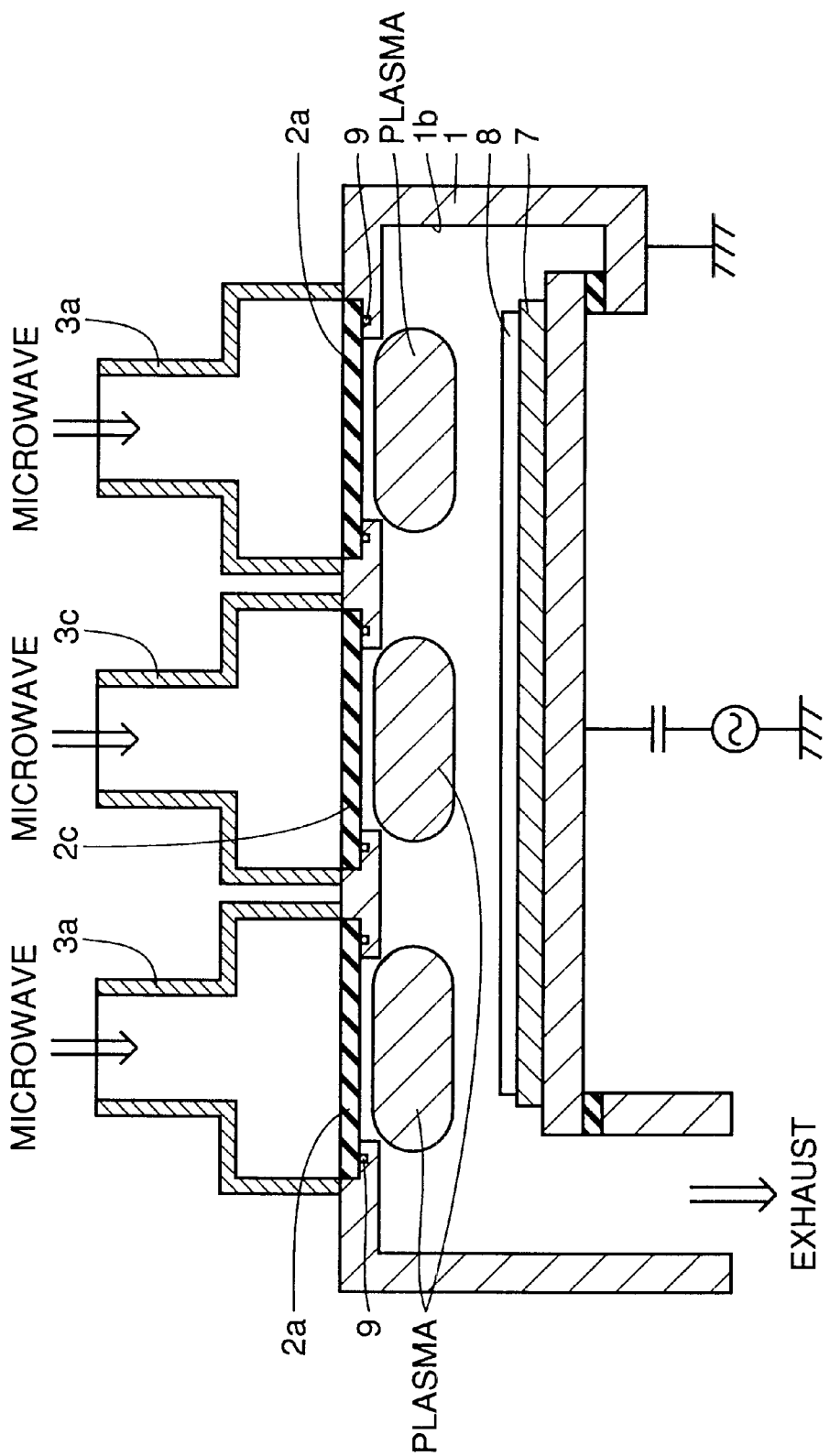
FIG. 8 is a schematic cross sectional view showing a configuration in the case where a plurality of waveguide transmission circuits for introduction of microwaves are used for a relatively large reaction chamber.

Thus, it is considered, as shown in FIG. 8, to divide the plasma generating region into several portions (i.e., to partition the microwave introduction window into several windows) and introduce microwaves thereto separately. However, this would not change the situation that the plasma immediately beneath microwave introduction window 2a and that immediately beneath microwave introduction window 2c are different in load impedance from each other. In addition, such different load impedance leads to different reflectance at the end of microwaves, thereby complicating the state of standing waves at the load side down from the matching device. Accordingly, if microwave of the same power are simply introduced into the partitioned microwave introduction windows 2a and 2c, the difference in impedance of the plasma cannot be compensated. As a result, the plasma process becomes uneven.

Figure 9:
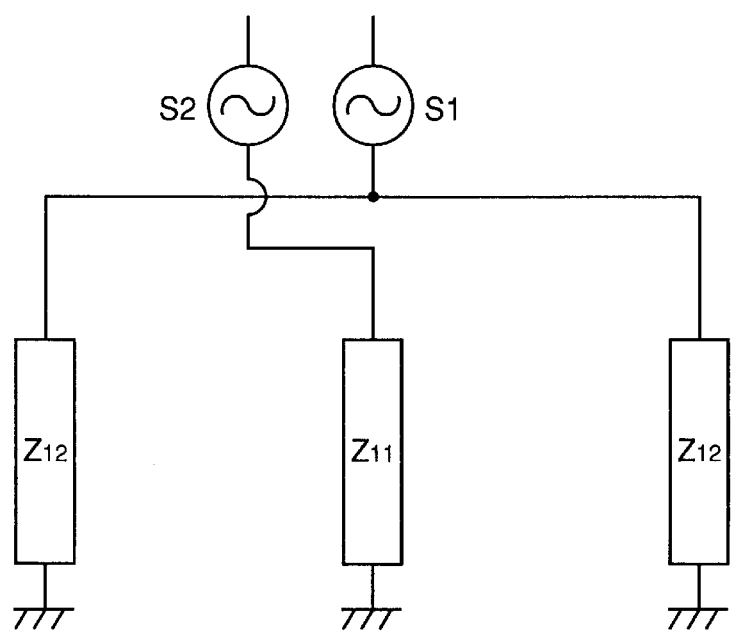
FIG. 9 illustrates load impedance of plasma as well as power supplying systems in the plasma process apparatus shown in FIG. 8.

Thus, the present invention is configured such that, with the plasma generating region being divided into several portions, as shown in FIG. 8, microwaves of different power are introduced into microwave introduction windows 2a and 2c that are non-equivalent to each other in location relationship with respect to sidewall 1b. More specifically, as shown in FIG. 9, separate power supplying systems S1 and S2 are used to independently introduce microwave of different power into the microwave introduction windows that are located above the regions having different load impedance $Z_{11}$ and $Z_{12}$. To the microwave introduction windows located above the regions having the same load impedance $Z_{12}$, the same power supplying system S1 is connected.

The plasma process apparatus of the present embodiment will now be explained regarding the equivalent circuits.

Figure 10:
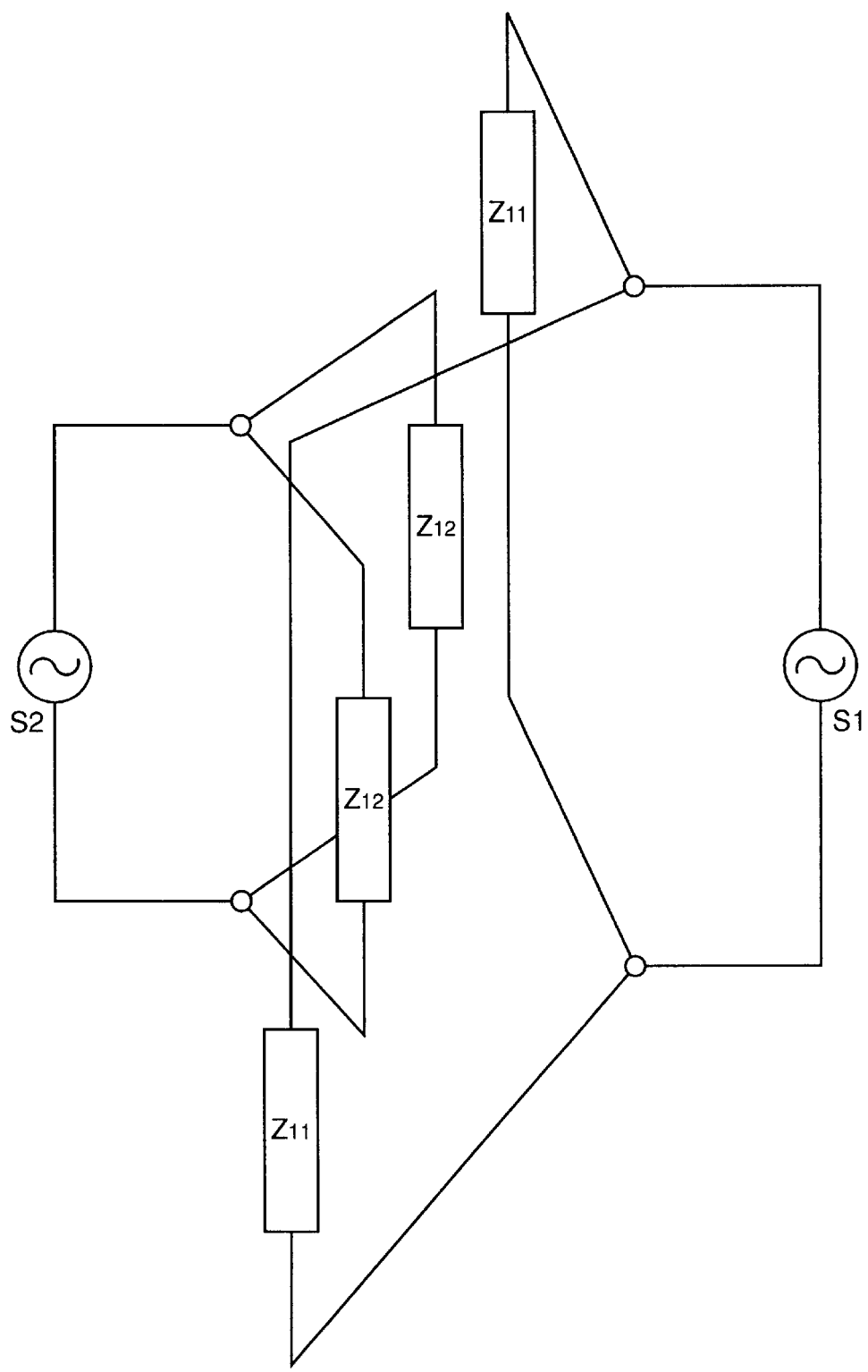
FIG. 10 is an equivalent circuit diagram of a plasma process apparatus according to the first embodiment of the present invention.

FIG. 10 shows an equivalent circuit configuration of the plasma process apparatus shown in FIGS. 1–3. Referring to FIG. 10, the equivalent circuit configuration includes two power supplying systems S1 and S2. Power supplying system S1 includes matching device 4a, isolator 5a, microwave oscillator 6a and the like. Power supplying system S2 includes matching device 4b, isolator 5b, microwave oscillator 6b and the like. Two identical loads $Z_{11}$ are connected in parallel to power supplying system S1. Similarly, two identical loads $Z_{12}$ are connected in parallel to power supplying system S2. Loads $Z_{11}$ and $Z_{12}$ are different from each other.

Load $Z_{11}$ represents load impedance of the plasma immediate beneath microwave introduction window 2a in FIG. 1. Load $Z_{12}$ represents load impedance of the plasma immediately beneath microwave introduction window 2b in FIG. 1. Two loads $Z_{11}$ exist corresponding to the number of microwave introduction windows 2a, two in this case, and similarly, two loads $Z_{12}$ exist corresponding to the two microwave introduction windows 2b.

In the present embodiment, to the circuits that are different in plasma load impedance when considered as the equivalent circuits, different power supplying systems are connected to introduce microwave of different power therein. To the circuits having the same plasma load impedance when expressed as the equivalent circuits, the same power supplying system is connected for application of microwave of the same power.

Referring again to FIG. 1, microwave transmission paths formed of branched waveguides 3a, 3b each have transmission path impedance, which includes the plasma load impedance. The factor affecting the transmission path impedance, however, is not limited to the plasma load impedance. Other factors as follows, for example, would also alter the transmission path impedance.

(1) A dielectric constant of a dielectric placed within the transmission path may respond to the field strength of the microwaves in a non-linear manner.

(2) The dielectric constant may change when the temperature of the dielectric placed within the transmission path changes.

(3) When the temperature of the walls of the reaction chamber changes, the surface gas adsorption ratio thereof may change correspondingly, which may cause a subtle change of the gas composition within the process chamber.

(4) If the power applied changes, the plasma density (the degree of ionization of the gas) may change correspondingly, which may alter the manner of propagation of microwaves into the plasma.

The factors (1) and (2) above are related to the material of the transmission path. They may be addressed by restricting the operation within a linear region, or by controlling the temperature at each portion. The factor (3) above can be addressed by controlling the temperature of the walls of the reaction chamber. The factor (4) can be addressed by adjusting a geometrical arrangement of the microwave introduction windows with respect to the sidewall of the reaction chamber, in addition to taking the countermeasures against the factors (1) to (3). As a result, upon the change in the manner of microwave propagation, the plasma states in the equivalent regions come to change in the same manner, thereby posing no problem.

In practice, it is important to adjust the assembled states of transmission paths formed of the waveguides.

Thus, by controlling the other factors, it becomes possible to make respective circuits including microwave introduction windows equivalent to each other in location relationship have identical transmission path impedance. To the circuits having the same transmission path impedance, the same power supplying system is connected for application of microwave of the same power. To the circuits having different transmission path impedance, different power supplying systems are connected for application of microwave of different power. Accordingly, it becomes possible to generate uniform plasma.

The operation of the plasma process apparatus of the present embodiment when used as a chemical vapor deposition (CVD) apparatus will now be described.

The interior of reaction chamber 1 is held in vacuum using a vacuum pump or the like in advance. Microwave generated from microwave oscillators 6a, 6b are led via isolators 5a, 5b and matching devices 4a, 4b to waveguides 3a, 3b, respectively, and further introduced into reaction chamber 1 from respective microwave introduction windows 2a, 2b. At this time, power of the microwave being introduced to microwave introduction windows 2a and 2b is separately adjusted, taking into consideration the load impedance immediately beneath those windows 2a and 2b.

Raw material gas is supplied from a gas feed tube into reaction chamber 1 as required.

When reaction gas is introduced into reaction chamber 1, entirely uniform plasma is generated by microwave. Thus, a uniform film is deposited on the surface of substrate 8 placed on substrate holder 7.

In the present embodiment, as shown in FIG. 1, microwave of the same power are introduced into microwave introduction windows 2a and 2a (or 2b and 2b) that are equivalent to each other in location relationship with respect to sidewall 1b of reaction chamber 1. In contrast, microwave different in power are introduced into microwave introduction windows 2a and 2b that are non-equivalent to each other in location relationship with respect to sidewall 1b. This makes it possible to generate plasma entirely uniform within process chamber 10. Accordingly, it becomes possible to perform a uniform plasma process even for a substrate of large area.

The configuration above is advantageous in cost saving, since a single microwave oscillator 6a (or 6b) can be used to introduce microwaves into microwave introduction windows 2a (or 2b) that are equivalent to each other in location relationship.

The present embodiment has been described above taking, as an example, the case where the microwave introduction window is partitioned into four portions, i.e., a so-called partition mode of (1, 4). However, the present invention can be applied to any partition modes as long as the number of partitions is at least three (i.e., partition mode (1, n) with $n \geq 3$).

Second Embodiment

The plasma process apparatus of the second embodiment of the present invention will now be described with reference to FIGS. 11 and 12. The cross section taken along the line I—I in FIG. 11 corresponds to the configuration shown in FIG. 1. The cross section taken along the line II—II in FIG. 11 corresponds to the configuration shown in FIG. 8

Figure 11:
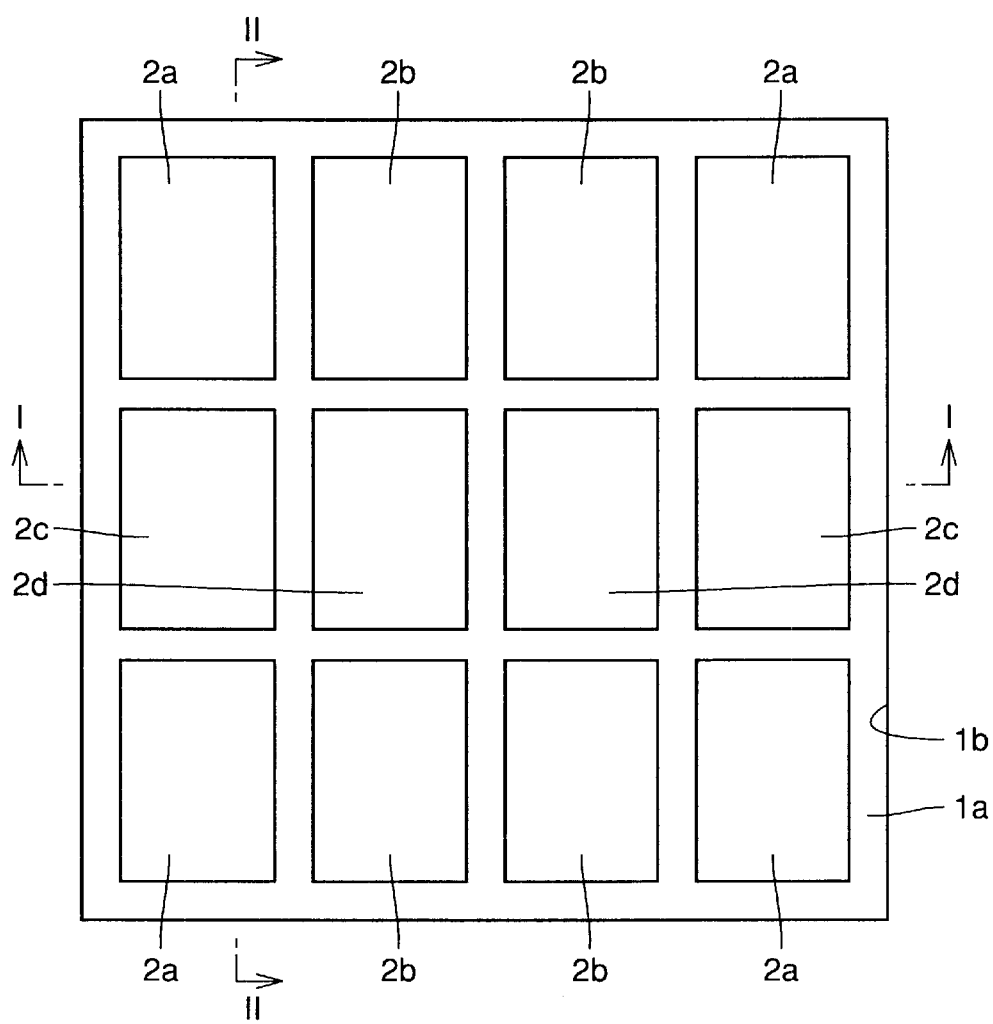
FIG. 11 is a diagram, corresponding to FIG. 3, of a plasma process apparatus according to a second embodiment of the present invention.
Figure 12:
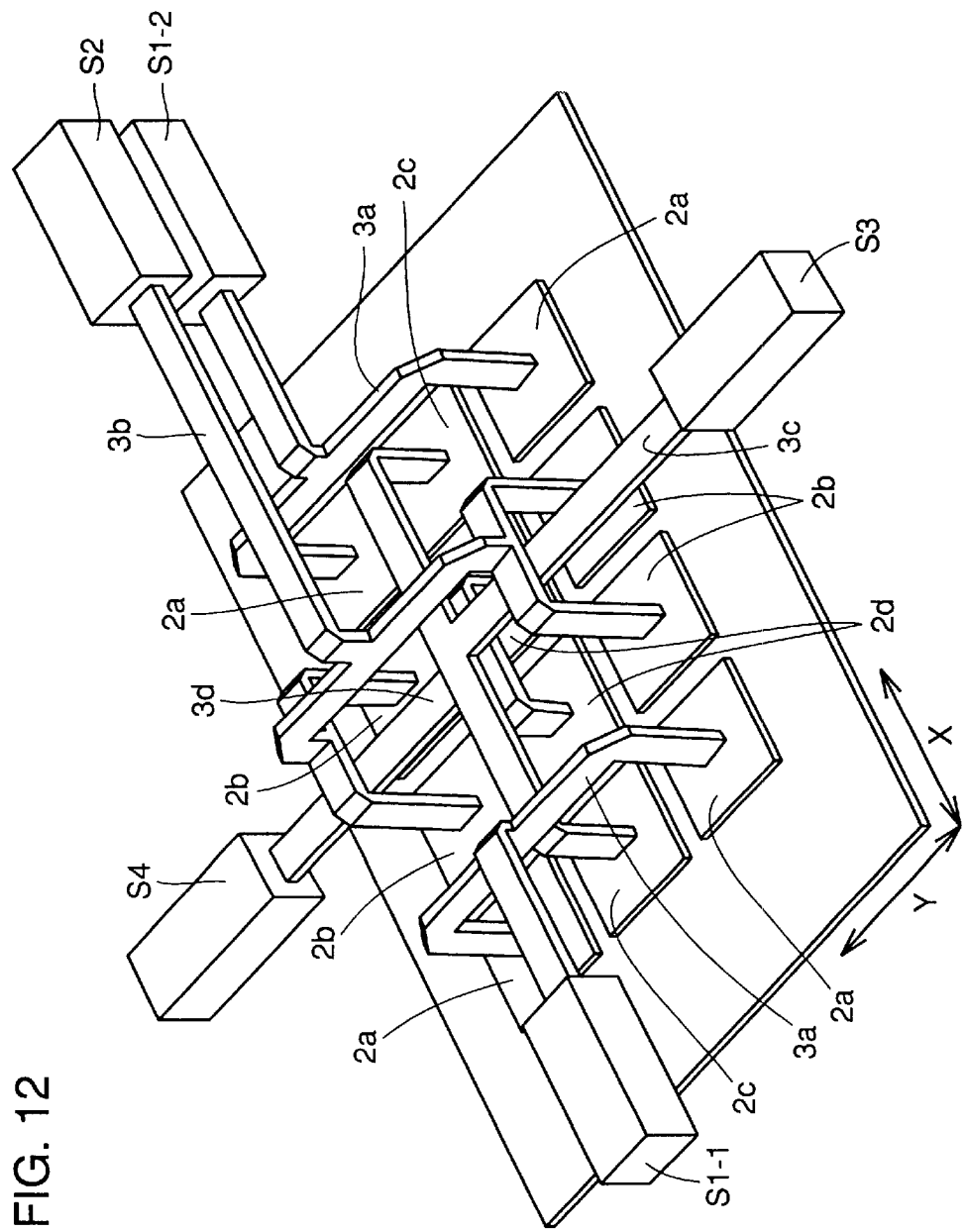
FIG. 12 is a perspective view showing a configuration of waveguide transmission circuits of the plasma process apparatus according to the second embodiment.

Referring to FIGS. 11 and 12, the present embodiment differs from the first embodiment in that the microwave introduction window on top surface 1a of reaction chamber 1 is partitioned into 12 windows.

Four microwave introduction windows 2a placed at the respective corners of top surface 1a of reaction chamber 1 are equivalent to one another in location relationship with respect to sidewall 1b of reaction chamber 1. Four microwave introduction windows 2b are also equivalent to one another in location relationship. Two microwave introduction windows 2c are equivalent to each other in location relationship, and two microwave introduction windows 2d are again equivalent to each other in location relationship. Microwave introduction windows 2a, 2b, 2c and 2d are non-equivalent to one another in location relationship.

Referring primarily to FIG. 12, two out of four microwave introduction windows 2a placed at the corners are connected via waveguide 3a to a power supplying system S1-1. The remaining two microwave introduction windows 2a are connected via waveguide 3a to another power supplying system S1-2. Four microwave introduction windows 2b are connected via waveguide 3b to a single power supplying system S2. Two microwave introduction windows 2c are connected via waveguide 3c to a single power supplying system S3, and two microwave introduction windows 2d are connected via waveguide 3d to a single power supplying system S4.

Power supplying systems S1-1 and S1-2 oscillate microwave of the same power. Power supplying systems S1-1 and S1-2 are separate from each other simply for convenience of configuration. They are preferably prepared as a single system, which is more desirable from the standpoint of device configuration and cost efficiency. More specifically, it is preferred that four microwave introduction windows 2a at the respective corners are all connected via waveguide 3a to a single power supplying system.

Thus, according to the present embodiment, microwave different in power are introduced to the microwave introduction windows that are non-equivalent to each other in location relationship, while microwave of the same power are introduced into the microwave introduction windows that are equivalent to each other in location relationship.

Otherwise, the configuration of the second embodiment is identical to that of the first embodiment, and thus, the same elements have the same reference characters allotted, and detailed description thereof will not be repeated.

The plasma process apparatus of the present embodiment will now be described regarding the equivalent circuits.

Figure 13:
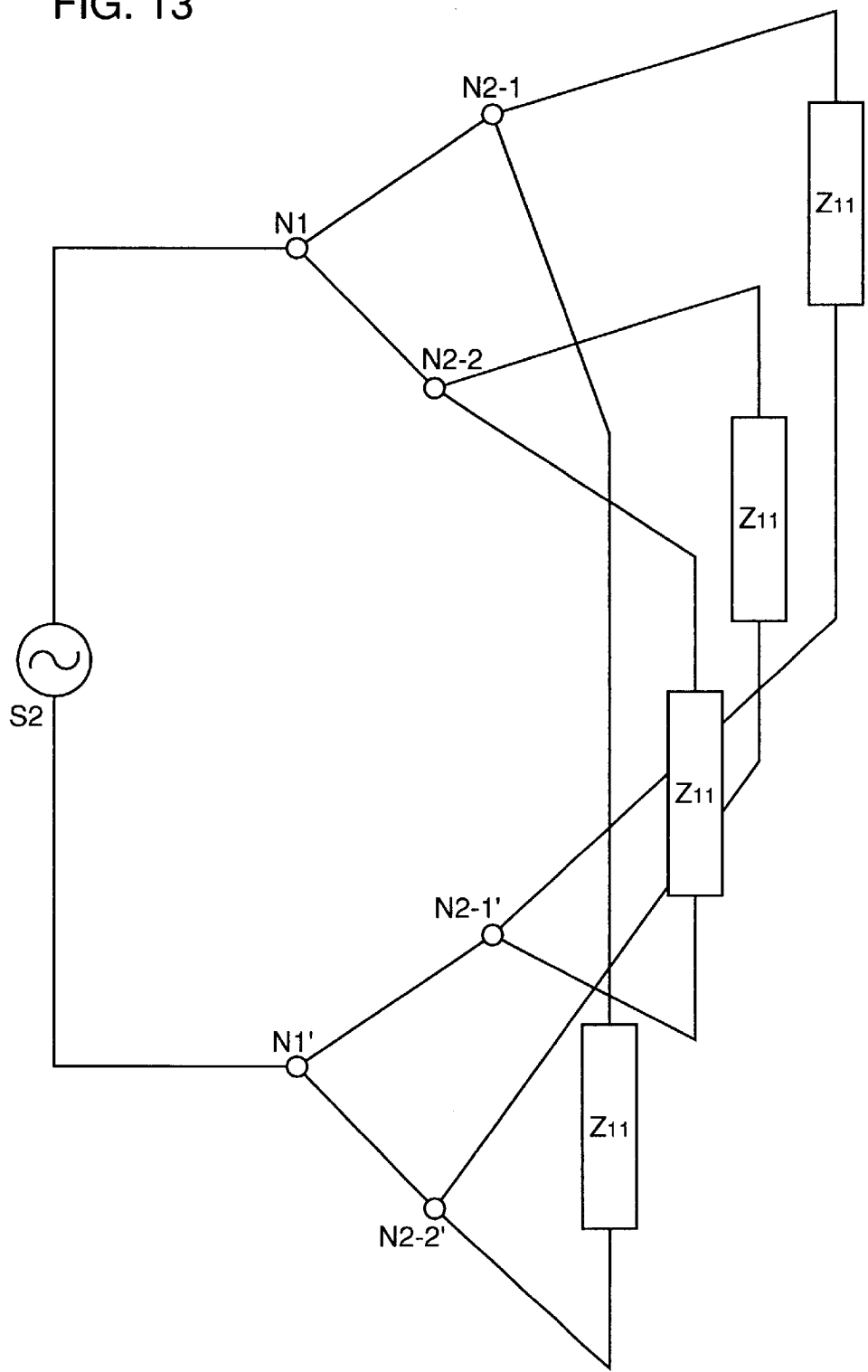
FIG. 13 is a diagram showing an equivalent circuit configuration of the plasma process apparatus according to the second embodiment.

FIG. 13 shows an equivalent circuit configuration of transmission paths for microwave via microwave introduction windows 2b of the plasma process apparatus shown in FIG. 12. Referring to FIG. 13, as all the microwave introduction windows 2b are equivalent in location relationship, load impedance $Z_{11}$ of the plasma immediately beneath the respective windows is essentially the same. To such microwave introduction windows 2b having essentially the same plasma load impedance $Z_{11}$ thereunder, microwaves of the same power are introduced by single power supplying system S2.

The equivalent circuit configurations in relation to other microwave introduction windows 2a, 2c and 2d each are essentially the same as that in FIG. 10, and therefore, description thereof will not be repeated.

To the microwave introduction windows that are non-equivalent to each other in location relationship, microwave of different power are introduced using different power supplying systems, since the load impedance immediately beneath those windows are different from each other.

Here, it should be ensured that respective circuits being connected to the same power supplying system have their transmission path impedance made essentially equal to each other by properly controlling other factors (1) to (4) that would alter the transmission path impedance as described in the first embodiment.

According to the present embodiment, again, microwave of the same power are introduced to microwave introduction windows that are equivalent to each other in location relationship with respect to sidewall 1b of reaction chamber 1, whereas microwave different in power are introduced to microwave introduction windows that are non-equivalent to each other in location relationship. Thus, as in the first embodiment, it is possible to generate plasma entirely uniform within the process chamber, whereby uniform plasma processing is ensured.

A single power supplying system will suffice for microwave introduction windows equivalent in location relationship, which is advantageous in cost saving.

The present embodiment has been described taking, as an example, the case where the microwave introduction window was partitioned into 12 windows, i.e., a partition mode of (3, 4). However, the present invention is applicable to any other partition modes (m, n).

Third Embodiment

Figure 14:
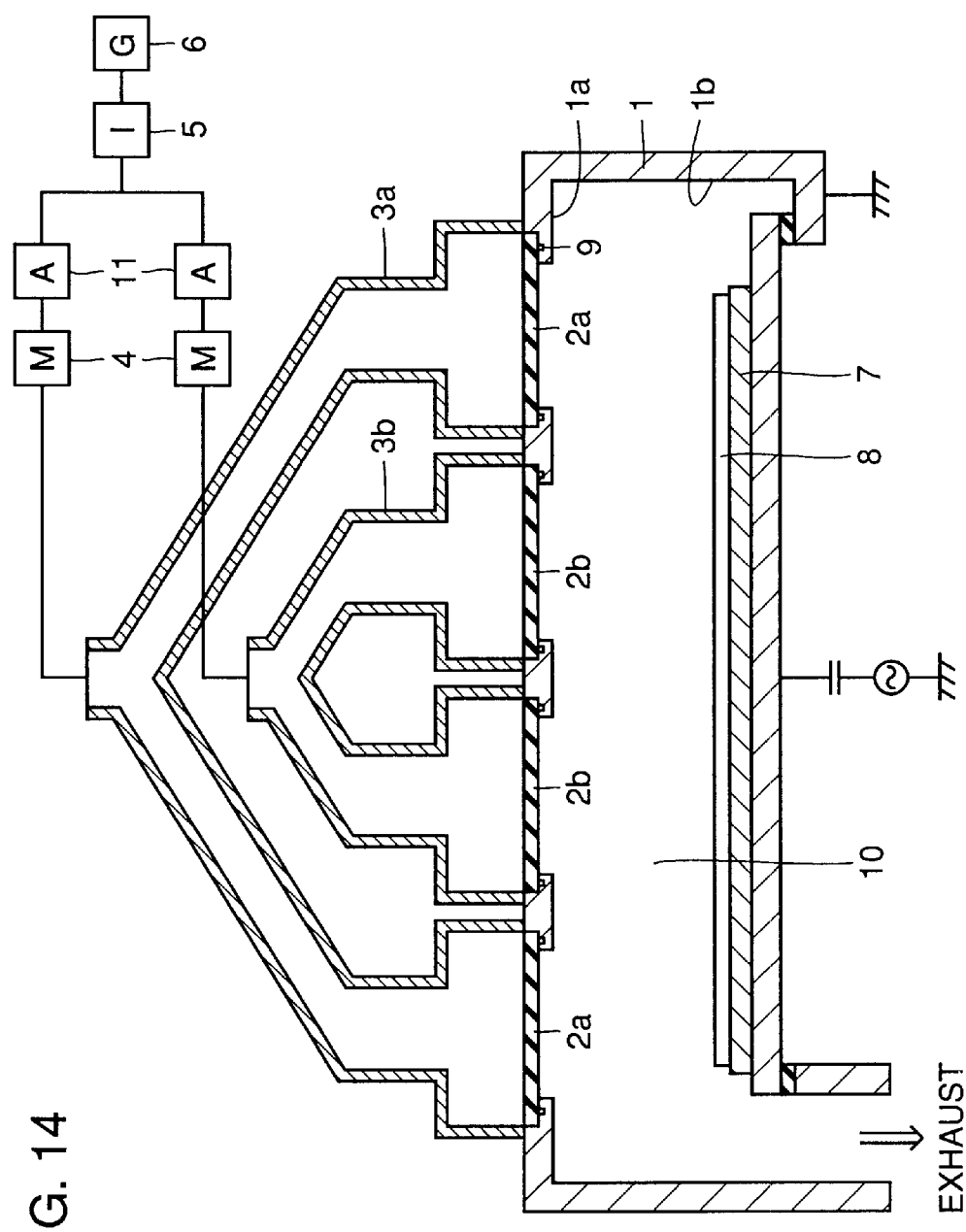
FIG. 14 is a cross sectional view, corresponding to FIG. 1, showing a configuration of a plasma process apparatus according to a third embodiment of the present invention.
Figure 15:
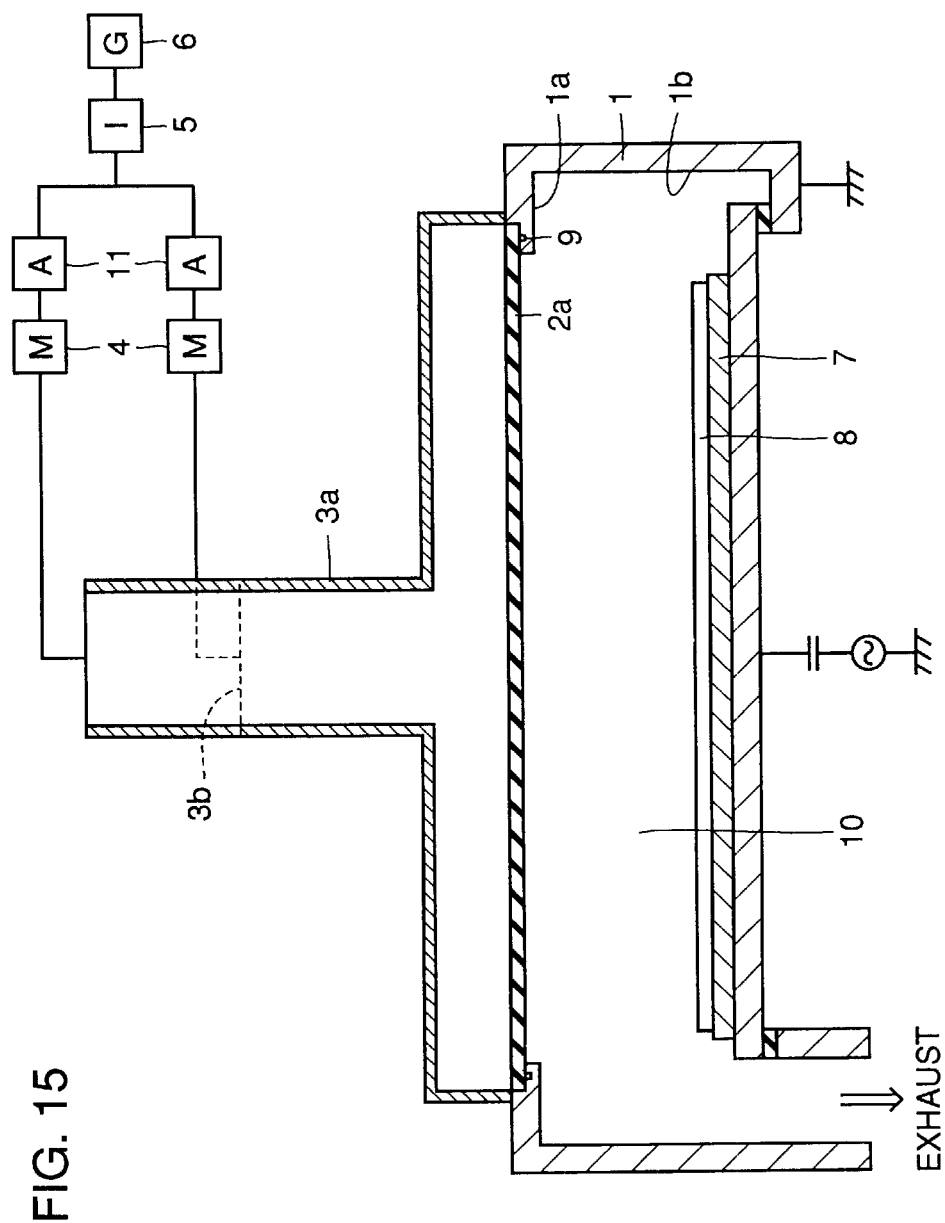
FIG. 15 is a cross sectional view, corresponding to FIG. 2, showing the configuration of the plasma process apparatus according to the third embodiment.
Figure 16:
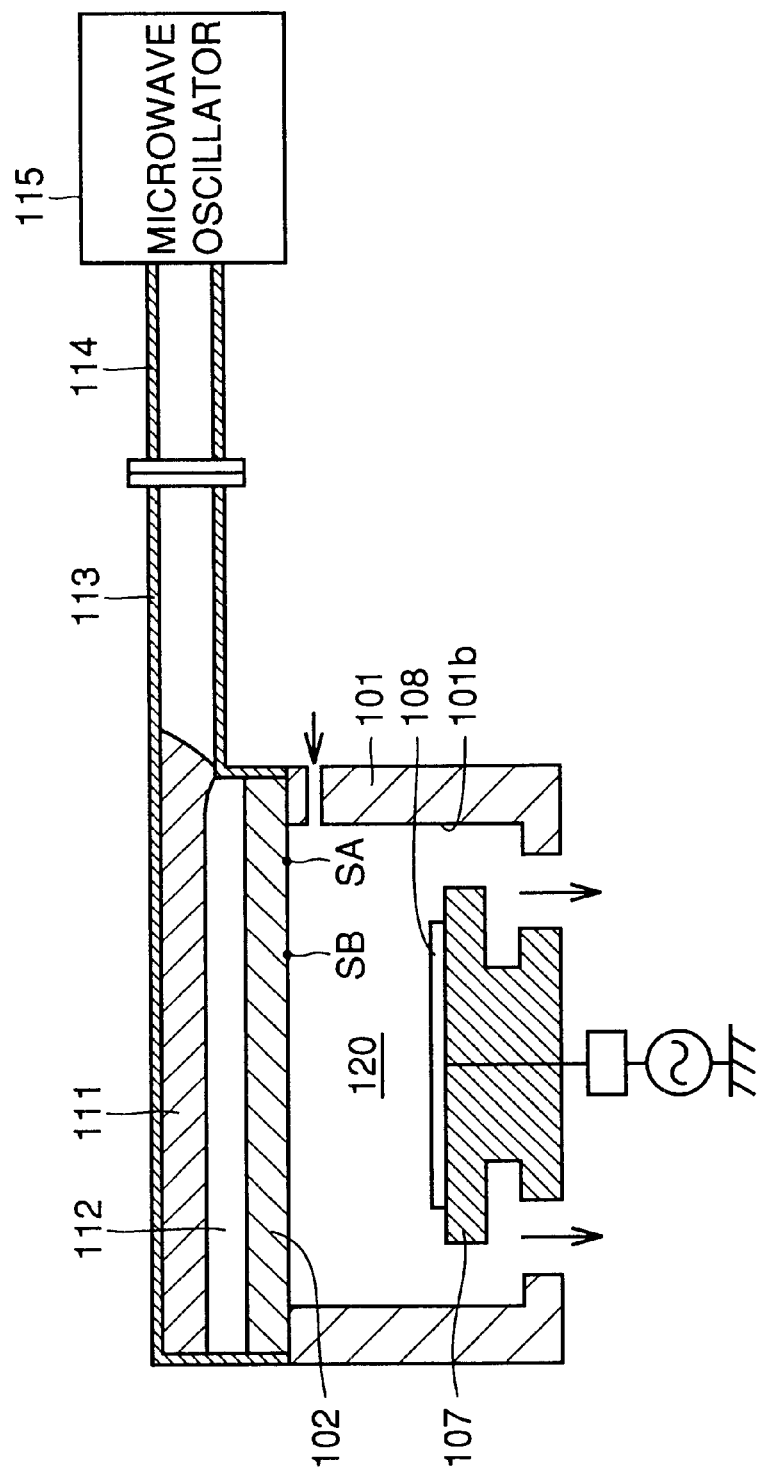
FIG. 16 is a vertical cross sectional view schematically showing a plasma process apparatus disclosed in Japanese Patent Laying-Open No. 11-111493.
Figure 17:
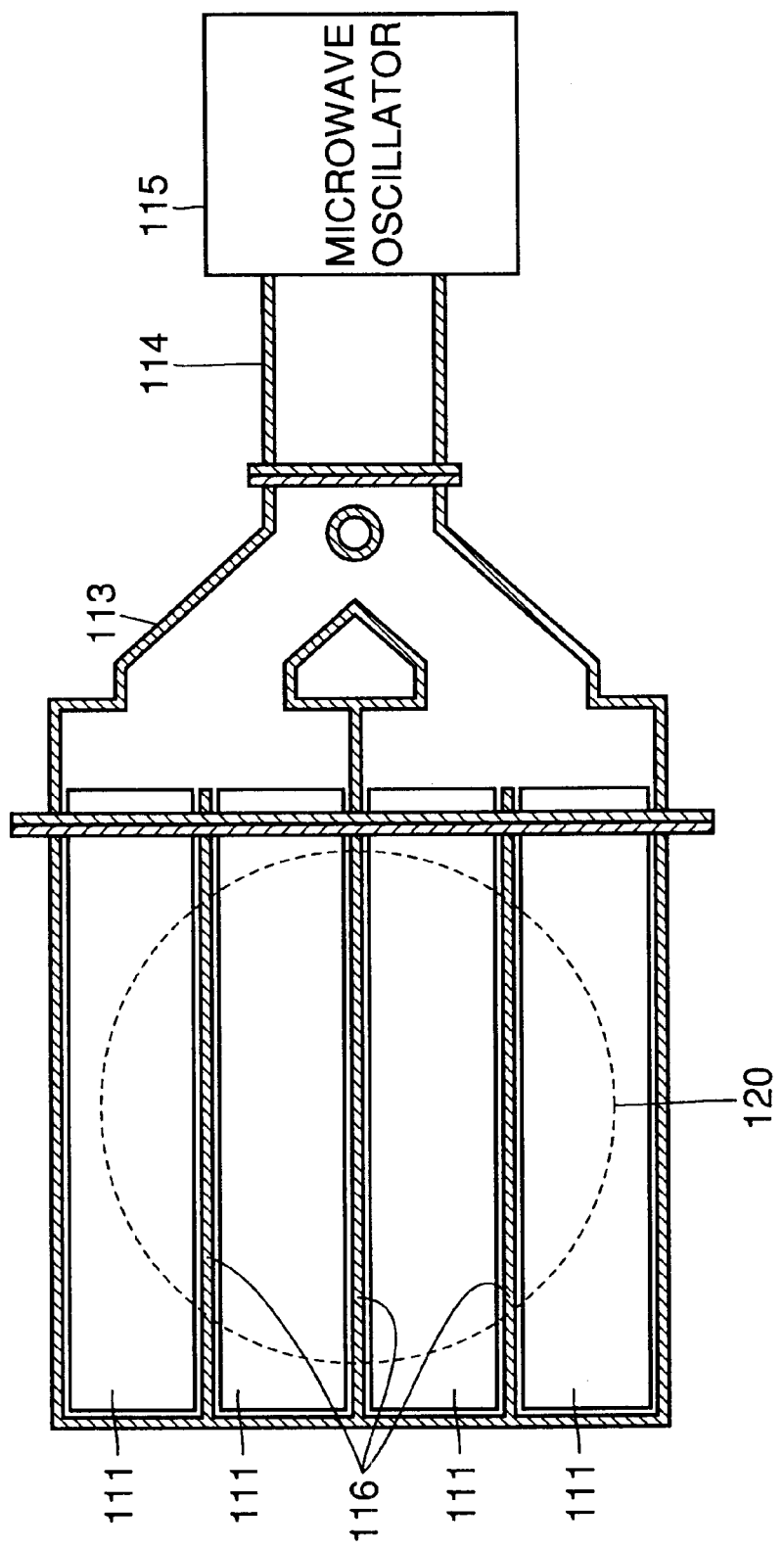
FIG. 17 is a horizontal cross sectional view schematically showing the plasma process apparatus disclosed in Japanese Patent Laying-Open No. 11-111493.

Referring to FIGS. 14 and 15, the plasma process apparatus of the present embodiment differs from that of the first embodiment in that microwave introduction windows 2a and 2b that are non-equivalent to each other in location relationship with respect to sidewall 1b of reaction chamber 1 are connected to the same microwave oscillator 6. In such a case where the microwave introduction windows non-equivalent in location relationship are connected to single microwave oscillator 6, it is necessary to provide a variable attenuator 11 for a respective branched portion. This variable attenuator 11 serves to adjust the amount of attenuation of the microwave. With variable attenuator 11 provided, it becomes possible to introduce microwave of different power to microwave introduction windows 2a and 2b located non-equivalent to each other in location relationship.

Otherwise, the configuration of the present embodiment is essentially identical to that of the first embodiment. Thus, the same members have the same reference characters allotted, and description thereof will not be repeated.

In the present embodiment, microwave introduction windows 2a and 2b that are non-equivalent in location relationship are connected to single microwave oscillator 6. Accordingly, it is possible to further simplify the structure of the apparatus compared to that of the first embodiment, which is more advantageous in cost saving.

Further, provision of variable attenuator 11 makes it possible to introduce microwave of different power into microwave introduction windows 2a and 2b that are non-equivalent in location relationship. Accordingly, it is possible to generate plasma entirely uniform within process chamber 10, which enables a uniform plasma process.

The present embodiment has been described taking the case of the partition mode of (1, n) as an example. However, it is applicable to any partition modes (m, n) as described in the second embodiment.

As explained above, the plasma process apparatus according to the present invention allows microwave different in power to be introduced into microwave introduction windows that are non-equivalent in location relationship with respect to the sidewall of the process chamber. Accordingly, even if load impedance of the plasma immediately beneath the respective microwave introduction windows differs from each other, it is possible to generate plasma entirely uniform within the process chamber. Thus, a uniform plasma process is enabled.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A plasma process apparatus for processing a substrate using reaction gas excited to a plasma state by microwaves, comprising:

a chamber having, with said substrate being held therein, a main wall opposite to a surface of said substrate and a sidewall surrounding a side of said substrate, for conducting the plasma process therein;

a plurality of discrete microwave introduction windows separated from each other provided on said main wall to face an interior of said chamber, for introducing the microwave into said chamber;

wherein, of said plurality of microwave introduction windows, at least two microwave introduction windows that are equivalent in distance with respect to said sidewall are for introducing microwaves of same power, and at least two microwave introduction windows that are of a different distance with respect to said sidewall are for introducing microwaves of different power; and a plurality of microwave waveguides for transmitting the microwave, wherein, for each of said microwave waveguides, one said microwave waveguide is branched and connected to respective ones of said at least two microwave introduction windows that are equivalent in distance relationship.

2. The plasma process apparatus according to claim 1, wherein, when plasma being generated in said chamber is represented as equivalent loads of parallel, lumped-constant circuits, load impedance of the plasma being generated by the microwave introduced from said at least two microwave introduction windows that are equivalent in distance relationship is essentially equal to each other.

3. The plasma process apparatus according to claim 1, further comprising a plurality of microwave oscillation sources for oscillating the microwave, wherein, for each of said microwave oscillation sources, one said microwave oscillation source is connected to said respective microwave waveguide.

* * * * *